United States Patent
Ito et al.

(10) Patent No.: US 7,458,044 B2
(45) Date of Patent: Nov. 25, 2008

(54) CDM ESD EVENT SIMULATION AND REMEDIATION THEREOF IN APPLICATION CIRCUITS

(75) Inventors: Choshu Ito, San Mateo, CA (US); Li Lynn Ooi, San Jose, CA (US); William Loh, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 221 days.

(21) Appl. No.: 11/349,358

(22) Filed: Feb. 7, 2006

(65) Prior Publication Data

US 2006/0245127 A1 Nov. 2, 2006

Related U.S. Application Data

(60) Provisional application No. 60/723,130, filed on Sep. 30, 2005, provisional application No. 60/677,098, filed on May 2, 2005.

(51) Int. Cl.
*G06F 17/50* (2006.01)
*G06F 9/45* (2006.01)

(52) U.S. Cl. .................................. 716/4; 716/1; 716/5

(58) Field of Classification Search ................ 716/2, 716/5, 1, 4
See application file for complete search history.

(56) References Cited

U.S. PATENT DOCUMENTS

| | | | | |
|---|---|---|---|---|
| 6,934,924 B2* | 8/2005 | Paul et al. | ....................... | 716/11 |
| 7,020,857 B2* | 3/2006 | Singh et al. | ..................... | 716/5 |
| 7,302,378 B2* | 11/2007 | Hayashi | ........................ | 703/14 |
| 2004/0098684 A1* | 5/2004 | Amekawa | ....................... | 716/6 |
| 2004/0153985 A1* | 8/2004 | Paul et al. | ...................... | 716/10 |
| 2004/0243949 A1* | 12/2004 | Wang et al. | ..................... | 716/4 |
| 2006/0075368 A1* | 4/2006 | Bakir et al. | .................... | 716/10 |
| 2007/0277138 A1* | 11/2007 | Lai et al. | ....................... | 716/12 |

* cited by examiner

*Primary Examiner*—Jack Chiang
*Assistant Examiner*—Magid Y Dimyan
(74) *Attorney, Agent, or Firm*—Duft Bornsen & Fishmar LLP

(57) ABSTRACT

Methods and structure for improved simulation of CDM ESD events and for remediation of circuit designs correcting for previously inexplicable damage to core circuits of an application circuit design caused by such events. Features and aspects hereof note that such previously inexplicable damage to core circuits of an application circuit design is caused by inductive coupling between the non-core circuits and the core circuits of an application circuit design. Improved simulation techniques in accordance with features and aspects hereof may predict where such inductive coupling may cause damage to core circuits. Other features and aspects hereof may alter an application circuit design to provide remediation by automated insertion of additional buffer circuitry to core traces of the core circuitry that may be impacted by such inductive coupling.

12 Claims, 5 Drawing Sheets

CDM ESD EVENT SIMULATION AND REMEDIATION THEREOF IN APPLICATION CIRCUITS

RELATED PATENTS

This patent application claims priority to U.S. Provisional Patent Application Ser. No. 60/677,098 filed 2 May 2005 and entitled CHARGE DEVICE MODEL (CDM) BASED ELECTROSTATIC DISCHARGE (ESD) PROTECTION and claims priority to U.S. Provisional Patent Application Ser. No. 60/723,130 filed 30 Sep. 2005 and entitled NEW ESD PROTECTION ELEMENT FOR CDM CORE FAILURE PREVENTION, both of which are hereby incorporated by reference.

The patent application is also related to, commonly owned, co-pending, U.S. patent application Ser. No. 11/349,356 filed herewith and entitled IMPROVED CDM ESD EVENT PROTECTION IN APPLICATION CIRCUITS, which is hereby incorporated by reference.

BACKGROUND OF THE INVENTION

1. Field of the Invention

The invention relates to simulation of charged device model ("CDM") electrostatic discharge ("ESD") events for a circuit and designing remedies therefore. More specifically, the improved simulation helps identify CDM ESD events that may damage core circuits of a circuit under test. Automated design tools may remedy the cause of the simulated circuit damage.

2. Discussion of Related Art

A frequent cause of failure in electronic circuit designs stems from ESD events. ESD events can generate substantial current flows and corresponding voltages within and application circuit that may easily damage a circuit design if left devoid of any protective measures. Thus, it is common for circuit designers to include ESD protection components for some circuitry in an application circuit design. Typically, such remedial components are added to circuits of the application design that are exposed to the external environment of the application circuit design. Such externally exposed circuits are susceptible to damage from ESD events. Thus, ESD clamp circuits and other familiar electronic designs are common for a circuit design engineer to utilize for all externally exposed circuit components of an application circuit design. Examples of externally exposed circuits are I/O circuits in which signals are exchanged between the application circuit and neighboring devices. As used herein, "core circuits" or "core components" refer to components of an application circuit design that are not I/O circuits.

The presumption of designers has generally been that if the externally exposed circuits of the application design are protected from damage by ESD events, then the other components of the application design (e.g., core components not generally externally exposed) will also be protected. The presumption assumes that since the damaging ESD current and voltage will be shunted away at the externally exposed circuits, then the core components will be safeguarded.

One particular type of ESD event has been widely recognized as a common type of event—typical of real world ESD events that frequently damage application circuits. The charged device model ("CDM") is now widely accepted as an accurate model of real world ESD events that frequently damage application circuits. A wide variety of testing systems and tools have been developed to aid application circuit designers and fabricators in generating such CDM ESD events for controlled, repeatable, robust testing of an application circuit's immunity to such events. Such test systems actually generate CDM ESD events in a controlled, repeatable manner so that actual application circuits may be tested in accordance with standardized CDM ESD conditions. A JEDEC specification for such CDM ESD testing is well known to those of ordinary skill in the art in readily available at www.jedec.org.

A problem has been noted during CDM ESD testing wherein core circuits of an application circuit design are inexplicably damaged despite adherence to design principles that provide ESD protection for externally exposed circuits (e.g., non-core circuits) in the application circuit design. For example, where voltage and current from an ESD event are properly blocked or shunted by ESD clamps or other ESD protection circuits applied to externally exposed circuitry, core circuits internal to the application circuit design may none the less be inexplicably damaged. Current design tools and simulation techniques have been incapable of addressing this collateral damage to core circuits caused by real ESD events and/or caused by ESD testing systems.

It is evident from the above discussion that a need exists for improved design tools and simulation tools to remediate an application circuit design to avoid such damage and to predict design flaws that may cause such damage in an application circuit design.

SUMMARY OF TH INVENTION

The present invention solves the above and other problems, thereby advancing the state of the useful arts, by providing improved simulation methods and structures to aid in identifying core circuits that may be susceptible to damage from CDM ESD events and by providing improved automated design methods and structures to remediate the identified core circuits by inserting buffer circuits to reduce effects of damaging induced current and voltages.

A feature hereof therefore provides a method for improving an application circuit design for protection from ESD events wherein the application circuit includes a plurality of core circuits and a non-core circuit, the method comprising: simulating application circuit design operation in response to a simulated CD ESD event applied to the non-core circuit to identify a core circuit inductively coupled to the non-core circuit; and automatically altering the application circuit design to add a protective circuit the core circuit identified as inductively coupled to the non-core circuit.

Another aspect hereof further provides that the step of simulating further comprises: characterizing electrical parameters of the application circuit; characterizing electrical properties of a package enclosing the application circuit; and characterizing electrical parameters of an ESD testing system used to generate ESD events applied to the application circuit through the package.

Another aspect hereof further provides that the step of characterizing electrical properties of a package enclosing the application circuit further comprises characterizing parasitic electrical characteristics of the package.

Another aspect hereof further provides that the step of characterizing electrical properties of the ESD testing system further comprises characterizing parasitic electrical characteristics of the testing system.

Another aspect hereof further provides that the step of simulating further comprises identifying a victim component of the core circuits in which simulated inductive current causes the victim component to receive a breakdown voltage, and provides that the step of automatically altering further comprises adding a buffer component to a signal path of the core circuits from which the victim component received the breakdown voltage in simulation.

Another aspect hereof further provides that the step of simulating further comprises: identifying a victim component of the core circuits in which simulated inductive current causes the victim component to receive a breakdown voltage; and identifying a core trace of the core circuits coupled to the victim component in which the simulated inductive current is induced, and wherein the step of automatically altering further comprises adding a buffer component to the identified core trace from which the victim component received the breakdown voltage in simulation.

Another aspect hereof further provides that the step of adding further comprises: identifying an R-layer trace of the non-core circuits that directly receives the simulated ESD event signal; identifying a portion of the identified core trace in which the simulated inductive current is induced by proximity to the identified R-layer trace wherein the identified portion has a driver circuit of the core circuits at one end of the identified portion and a receiver circuit of the core circuits at an opposite end of the identified portion; and inserting in the application circuit design a buffer circuit in the identified portion between the driver circuit and the receiver circuit to reduce the induced voltage applied to the receiver circuit.

Another feature hereof provides a system for reducing susceptibility to damage to a core circuit of an application circuit design due to CDM ESD events applied to a non-core circuit of the application circuit, the system comprising: a simulation system adapted to identify a core trace coupled to the core circuit susceptible to inductive coupling with the non-core circuit; and a design system for designing the application circuit design and communicatively coupled to the simulation system and adapted to automatically alter the application circuit design to insert a buffer circuit in the identified core trace to prevent damage to the core circuit in response to CDM ESD events.

Another aspect hereof further provides that the simulation system is adapted to identify the core trace as a trace coupled to the core circuit in which an induced current applies an induced voltage to the core circuit in excess of a breakdown voltage associated with the core circuit.

Another aspect hereof further provides that the design system is further adapted to identify an R-layer trace of the non-core circuit that directly receives the simulated ESD event signal, and provides that the design system further adapted to identify a portion of the identified core trace in which the simulated inductive current is induced by proximity to the identified R-layer trace wherein the identified portion has a driver circuit at one end of the identified portion and a receiver circuit at an opposite end of the identified portion, and provides that the design system is further adapted to insert the buffer circuit in the application circuit design in the identified portion between the driver circuit and the receiver circuit to reduce the induced voltage applied to the receiver circuit.

Another feature hereof provides a method, operable in a data processing system, for designing an application circuit to reduce susceptibility of the application circuit to damage of core circuits of the application circuit due to CDM ESD events applied to non-core circuits of the application circuit, the method comprising: identifying an R-layer trace coupled to a non-core circuit of the application circuit that may receive a CDM ESD event; identifying one or more core traces within the application circuit that are inductively coupled with the R-layer trace such that the magnitude of an induced current in response to the CDM ESD event may induce a voltage at a receiver circuit couple to the core trace in excess of the breakdown voltage of the receiver circuit; and inserting a buffer circuit in each of the identified one or more core traces such that the induced voltage applied to the receiver circuit in response to the CDM ESD event remains below the breakdown voltage.

Another aspect hereof further provides for identifying a portion of each of the identified one or more core traces that receives the induced current, and provides that the step of inserting further comprises inserting the buffer circuit in the identified portion to minimize induced voltage applied to the receiver circuit and to minimize the induced voltage applied to the buffer circuit.

Another aspect hereof further provides that the step of inserting further comprises inserting the buffer circuit at substantially the midpoint of the identified portion.

DETAILED DESCRIPTION OF THE DRAWINGS

Figure 1:
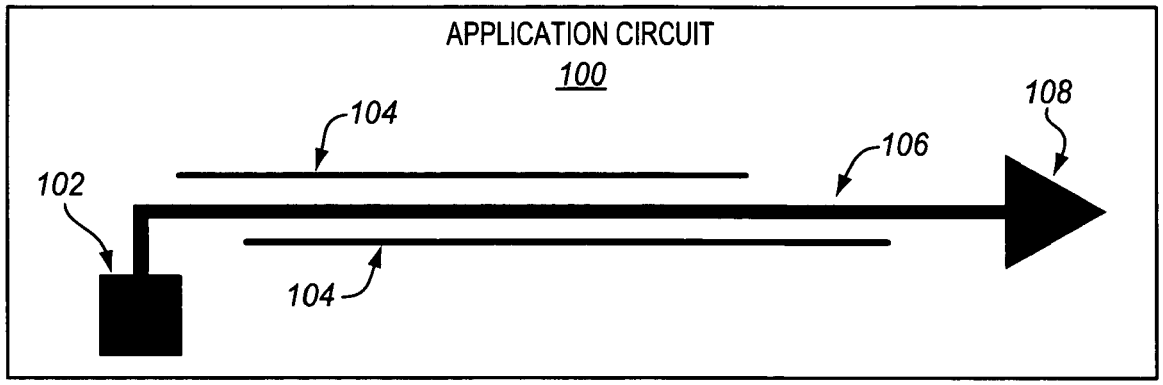
FIG. 1 is a block diagram of an application as presently practiced devoid of CDM ESD remediation.

FIG. 1 is a block diagram of a typical application circuit 100 as presently known in the art. FIG. 1 represents an abstract schematic top view of components associated with an integrated circuit 100. Typical integrated circuits comprise a number of layers descending from the top layer through intermediate layers and a bottom layer. A top-most conductive layer, often referred to as the "R-layer", may include I/O signaling components and corresponding conductive traces. For example, in the exemplary application circuit 100 as presently known in the art, a "bump" or connection 102 represents a connecting point for an I/O signal of the application integrated circuit 100. R-layer trace 106 couples the I/O signal bump 102 conductor to an appropriate I/O buffer 108 (e.g., driver/receiver circuitry). Buffer 108 may typically include an ESD clamp circuit useful for guarding the I/O buffer 108 from damage due to ESD discharge. The clamp circuit may be integrated with the receiver circuit 108 or may be a separate, discrete component (not shown). Other components (e.g., core components) of application circuit 100 may include corresponding conductive traces 104 coupling driver components (not shown) to corresponding receiver components (not shown). Such additional components often reside in successive layers of the application circuit 100 below the R-layer. For simplicity of this description, associated driver and receiver components and other functional logic elements within the application circuit 100 are eliminated. In addition, a typical application circuit 100 would include a plurality of non-core components externally exposed for coupling with other devices as well as a plurality of core devices for performing desired logic functions.

Figure 2:
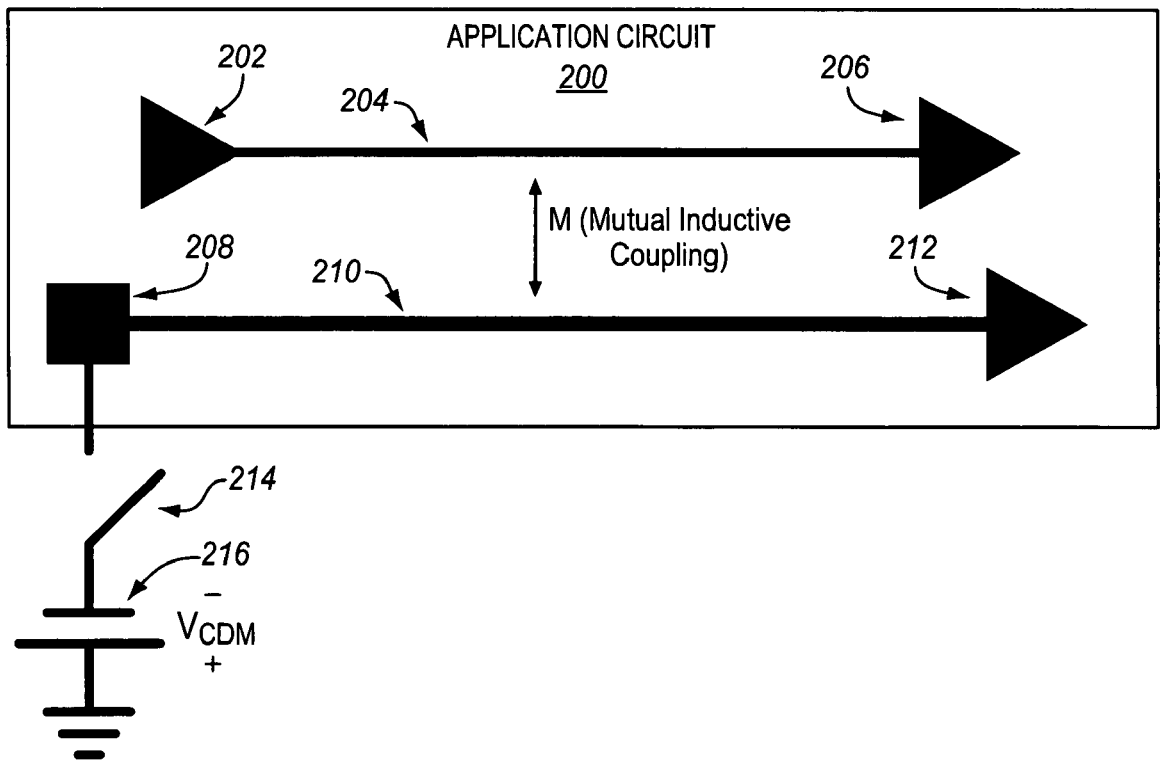
FIG. 2 is a block diagram of an exemplary application circuit depicting the mutual inductive coupling concern realized as an aspect hereof.

As shown in FIG. 1, core traces 104 may be positioned by lay-out tools of circuit design tools to be substantially parallel to the R-layer trace 106 (current design tools provide no basis for avoiding such parallel lay-out of traces). A similar application circuit 200 is shown in FIG. 2 in which additional details are provided explaining the realization associated with features and aspects hereof wherein it is noted that a core trace 204 that is laid out substantially parallel to an R-layer trace 210 and sufficiently proximate the R-layer trace 210 may be inductively coupled thereto as indicated by the double headed arrow labeled "M" (e.g., "mutually inductive coupling"). In particular, R-layer trace 210 couples bump 208 to I/O buffer 212 for purposes of exposing associated I/O signals for coupling of other circuits to application circuit 200. Core circuits associated with the application circuit 200 may include, for example, a driver component 202 coupled via core trace 204 to a receiver component 206 for purposes of driving a particular functional signal from the driver component 202 for application to the receiving component 206.

Current application circuit design tools may lay out core trace 204 in close proximity to R-layer trace 210. A realization associated with features and aspects hereof notes that if core trace 204 is sufficiently close to an R-layer trace 210, a mutual inductive coupling (indicated as double-ended arrow "M") condition may arise in the circuit structure. Such mutual inductive coupling is similar in effect to so called crosstalk of electronic signals in circuit designs. During normal operation of the application circuit 200, any interference associated with such mutual inductive coupling (e.g., crosstalk) may be negligible and therefore is frequently ignored the current design tools. However, in the presence of an ESD event, in particular a CDM ESD event, a significant induced electrical current may arise in core trace 204 due to the mutual inductive coupling with R-layer (e.g., externally exposed) trace 210.

In general, as is known in the art, a CDM ESD event occurs when the application circuit is charged to a potential relative to ground (either a negative or positive potential) and then is rapidly discharged through a coupling to ground. As shown in FIG. 2, switch 214 represents a logical coupling of application circuit 200 via bump 208 to ground potential such that any CDM related charge accumulated in or on the application circuit may be rapidly discharged to ground. Such a CDM accumulated charge is indicated in FIG. 2 as $V_{CDM}$. Switch 214 and potential $V_{CDM}$ are not necessarily physically present such as when the discharge occurs in a real environment as distinct from a test environment. Switch 214 and potential $V_{CDM}$ may be actually present in a test environment in which a CDM ESD test system is used to controllably apply a precise CDM ESD event to an application circuit for purposes of testing immunity of the circuit to such events according to standardized, specified conditions.

Even a modest magnitude of such a CDM ESD discharge can generate a substantial current flow in R-layer trace 210. As is generally known in the art, I/O buffer 212 generally is protected from damage by clamp circuitry (sometimes integrated within buffer 212 or sometimes a discrete component—not shown) to protect the logic function of I/O buffer 212 from damage due to such rapid ESD discharge. Though VO buffer 212 may be protected from damage, the substantial current flow in R-layer trace 210 may induce a current flow in nearby neighboring core traces such as core trace 204. This inductive coupling is indicated in FIG. 2 as double-ended arrow "M". The induced current in core trace 204 may generate a significant potential at a gate of the receiving component 206 coupled to the core trace 204. This potential may easily exceed the breakdown voltage of the gate of the receiving component 206. The magnitude of the potential applied to the gate depends on a number of factors including, for example, the length of the core trace 204, the length of the R-layer trace, and the proximity of the two traces. These and other parameters may be characterized in the application circuit design and/or derived from information therein. Thus, a circuit simulation system may simulate such a CDM ESD event and may identify an R-layer trace and a corresponding core trace that may be inductively coupled so as to possibly generate a harmful induced current and voltage in the core circuits (e.g., at a gate of receiver component 206) in response to a CDM ESD event.

Figure 3:
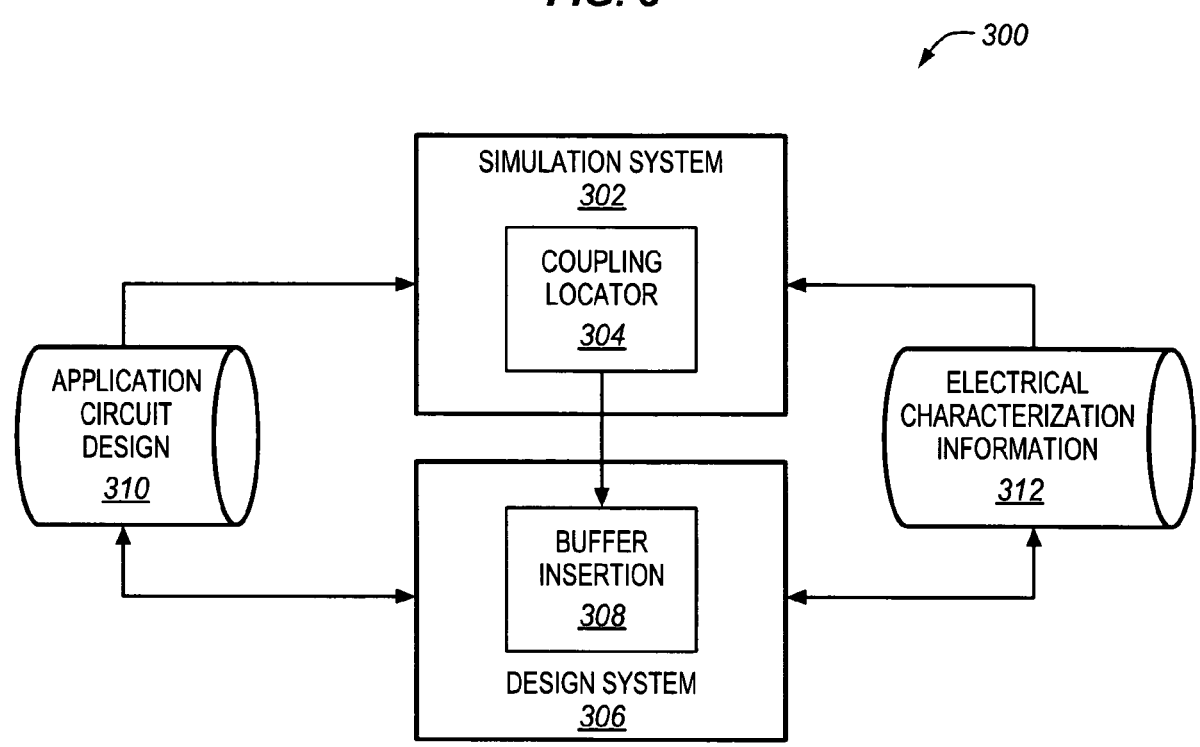
FIG. 3 is a block diagram of a system embodying features and aspects hereof to identify core traces affected by simulated CDM ESD events and to remediate the identified core traces to avoid damage from such events.

FIG. 3 is a block diagram of a system 300 in accordance with features and aspects hereof to identify possible mutually inductively coupled traces and to remediate the coupling to avoid CDM ESD damage therefrom. Application circuit design 310 contains design information regarding the application circuit useful for both circuit design systems and useful for circuit simulation systems. Design information 310 may include, for example, information identifying circuit components (and parameters thereof) that make up the functional elements of the application circuit as well as layout information regarding physical placement of circuit components in the integrated circuit die and information locating conductive traces coupling the various circuit components.

Using this design information 310, a simulation system 302 may simulate operation of the application circuit. The simulation system 302 may include an inductive coupling locator component 304 that identifies traces in the application circuit design 310 that may be inductively coupled in a manner that could damage core circuits in response to an applied CDM ESD event. The simulation system may receive information 312 that characterizes electrical properties that relate to the mutually inductively coupled traces and components coupled thereto. This information may be provided as indicated as a separate source of information or may be integrated with the application circuit design 310. The characterization information 312 may include information that characterizes electrical properties of the application circuit relating to inductive coupling. The electrical characterization information 312 may include resistance, inductance, and capacitance properties of the application circuit. The information 312 may further include electrical properties of the packaging of the application circuit. The packaging may impact the CDM charge level and hence the potential that may be discharged in a CDM ESD event. Electrical properties of the packaging may include parasitic resistance, inductance, and capacitance properties of the packaging of the application circuit. Still further, in simulating a controlled CDM ESD discharge event such as generated in an ESD testing system, electrical properties of the ESD testing system may also be specified in the characterization information 312. An ESD testing system typically couples through the packaging of the application circuit and hence may itself present parasitic electrical properties of resistance, inductance, and capacitance in its coupling to the application circuit package.

Having so located inductively coupled traces in the application circuit design 310 by operation of simulation system 302, design system 306 is invoked to automatically remediate the identified inductive coupling. In particular, buffer insertion component 308 within design system 306 may insert one or more buffer circuits into one or more portions of the core traces found to be inductively coupled to be potentially damaged by CDM ESD events. An appropriate buffer circuit may be any device that aids in shunting or absorbing a portion of the potentially damaging induced current in the core trace located by simulation system 302. Further, the inserted buffer circuit may reduce potentially harmful voltages formed by mutual coupling by breaking up the core trace into two (or more) sections coupled to the R-layer trace—a first portion for which the potentially damaging voltages are reduced by the buffer circuit and a second portion which provide less coupling than the entire core trace prior to buffer insertion and thus may generate voltages below the breakdown or other threshold for damage.

By so shunting a portion of the potentially damaging induced current and/or reducing the magnitude of induced voltages, components associated with the identified core trace determined to be inductively coupled to an R-layer trace may be protected from receiving breakdown voltage levels that may damage the core components. In addition to inserting one or more such buffer circuits, design system 306 may also automatically adjust driver and/or receiver circuits associated with the identified core trace to compensate for potentially altered timing of the core signal associated with the core trace. Well known design choices may be employed to select the size of the driver circuits, receiver circuits, and inserted buffer circuits applied to the core trace to adjust the signal timing as required to mitigate timing effects of the inserted buffer circuit.

Simulation system 302 and design system 306 may therefore operate repetitively to evaluate potential inductive coupling for each core trace and/or for each R-layer trace that may receive potentially harmful current either directly from a CDM ESD event or indirectly induced by the event. In other words, simulation system 302 may simulate CDM ESD events applied to each of potentially multiple R-layer components of the application circuit and evaluate all core traces that may be affected by harmful induced current and associated excessive voltages. Thus, design system 306 modifies the application circuit design 310 to insert as many buffer circuits as may be determined appropriate by at the repetitive simulations utilizing simulation system 302

Those of ordinary skill in the art will readily recognize a wide variety of well known, commercially available design and simulation tools for such application circuit design. Common hardware description languages ("HDL") including for example Verilog HDL ("VHDL"), well known to those of ordinary skill in the art, may be used both for simulation of and for modifications to the application circuit design to remediate any identified inductive coupling between R-layer circuits and core circuits. Further, those of ordinary skill in the art will readily recognize that simulation system 302 and design system 306 may be distinct design and simulation tools or may be integrated within a single design and simulation product. In either case, well known design interchange formats may be used for identifying core traces for which buffer insertion may be required and for modifying an application circuit design accordingly.

Simulation system 302 in design system 306 may be implemented as application programs running in standard personal computers and/or engineering workstations. Such application programs may include well known commercially available products or may include custom designed tools for a particular circuit design enterprise. Still further, characterization information 312 may be obtained directly from the application circuit design as well as vendors that supply circuit designs, from packaging designs, and ESD testing systems. Alternatively, electrical characterization of the application circuit, its associated packaging, and any CDM ESD testing systems may also be derived empirically by performing test operations and measuring the relevant characteristics or computing relevant characteristics given well-known models for such components.

Figure 6:
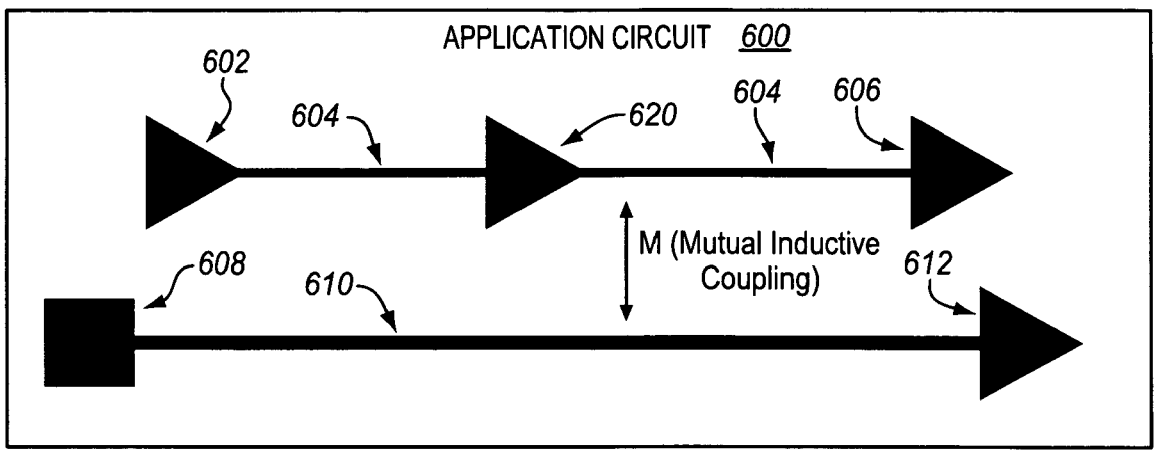
FIGS. 6-8 are block diagrams depicting exemplary application circuits enhanced in accordance with features and aspects hereof to insert buffer circuits to shunt induced current and thereby remediate damage to core circuits.

FIG. 6 is a block diagram of an application circuit 600 similar to that shown in FIG. 2 but modified by, for example, the system 300 of FIG. 3 to insert a buffer circuit in an identified core trace determined to be inductively coupled to an R-layer trace. In particular, R-layer trace 610 couples bump 608 to an I/O buffer circuit 612. Core trace 604 couples driver component 602 to receiver component 606 to exchange a signal therebetween for normal operation of applications 600. By operation of an appropriate simulation system, core trace 604 may be identified as a trace inductively coupled to R-layer trace 610 such that a CDM ESD event applied through bump 608 to R-layer trace 610 may induce damaging current and voltage levels on core trace 604. Without appropriate remediation, such induced current and voltage may damage receiver component 606 of application circuits 600.

In accordance with features and aspects hereof, core trace 604 is so identified as inductively coupled and buffer 620 is inserted therein between driver component 602 and receiving component 606 to shunt a portion of potentially damaging induced current and voltage. As shown in FIG. 6, inserted buffer circuit 620 may be inserted substantially at the midpoint along the core trace 604 between driver component 602 and receiving component 606. Thus, approximately half of the induced current along core trace 604 may be shunted by inserted buffers circuit 620. Therefore, inserted buffer circuit 620 and receiver receiving component 606 may each receive an induced voltage signal that remains below their respective breakdown voltage levels thus sparing the core circuit comprising driver 602, core trace 604, buffer 620 and receiver 606 from potential damage from a CDM ESD event.

Those of ordinary skill in the art will readily recognize that the application circuit 600 is merely intended as a representative of a circuit enhanced with a remedial inserted buffer 620 inserted in accordance with features and aspects hereof. Application circuits 600 is therefore not intended to represent a fully functional application circuit but is merely simplified to exhibit exemplary embodiments of features and aspects hereof relating to protection of core components from damage due to CDM ESD events.

Figure 7:
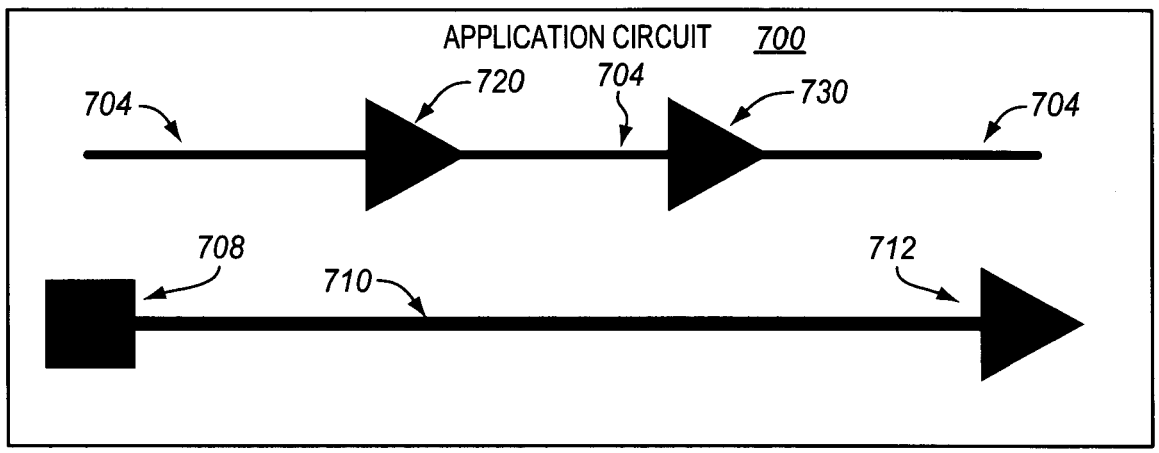

FIG. 7 represents another exemplary application circuit similar to that of FIGS. 2 and 6 in which multiple buffer circuits 720 and 730 may be inserted along core trace 704 to avoid damage to corresponding driver and/or receiving components (not shown) due to induced current and voltage caused by inductive coupling to R-layer trace 710. By inserting multiple buffer circuits along a portion of core trace 704 inductively coupled to R-layer trace 710, additional potentially damaging induced current and voltage may be shunted by the combined effect of multiple buffer circuits 720 and 730 to avoid damage to any components associated with the core circuits of application circuit 700.

Figure 8:
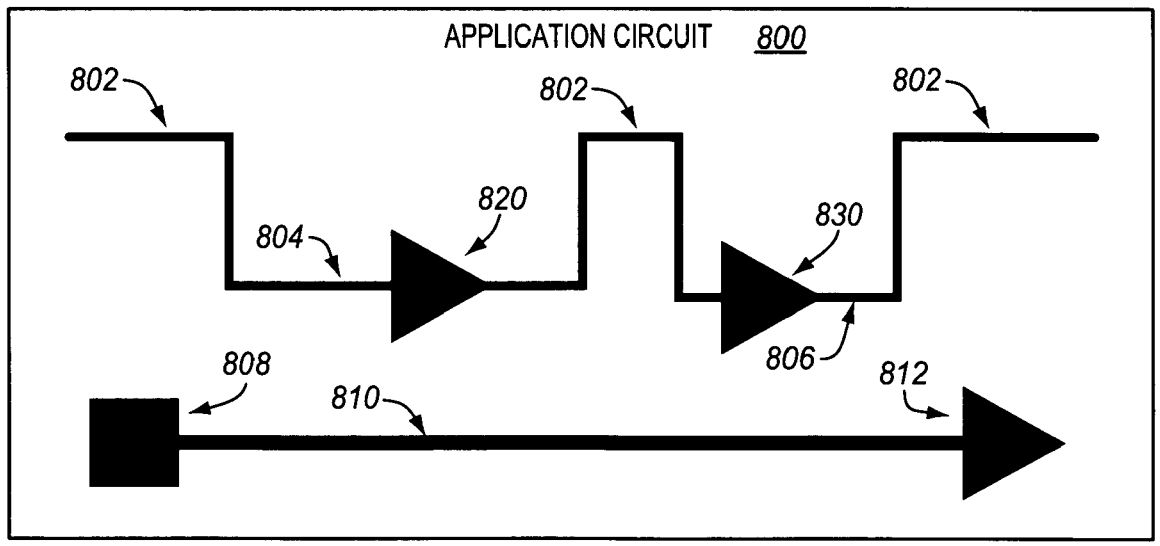

FIG. 8 shows yet another exemplary application circuit 800 enhanced in accordance with features and aspects hereof similar to FIGS. 2, 6, and 7 to remediate potential damage to core circuits caused by induced current and voltage arising from a CDM ESD event. Core trace 802 may include multiple portions 804 and 806 that may each be inductively coupled to R-layer trace 810. Other portions of core trace 802 may be far enough displaced from R-layer trace 810 to not experience significant induced current or voltage. Remediation in application circuit 800 may involve insertion of multiple buffer circuits 820 and 830 each inserted in a corresponding portion 804 and 806, respectively, of the core trace in which induced current and voltage may be received. Thus, a buffer circuit may be inserted in each such portion of core trace 802 positioned in lay out close enough to R-layer trace 810 to potentially receive harmful induced current and voltage. Still further, those of ordinary skill in the art will readily recognize that aspects of FIGS. 6 through 8 may be combined in that one or more buffer circuits may be inserted in each of one or more portions of a core trace sufficiently positioned proximate an associated R-layer trace as to receive potentially harmful induced current and voltage. Thus, FIGS. 6 through 8 are intended merely as representative of myriad remedial solutions wherein one or more buffer circuits may be inserted into appropriate locations of an identified core trace to avoid damaging driver and/or receiving components associated with the core trace. Still further, any number of core traces may be identified as associated with a particular R-layer trace and any number of R-layer traces may be associated with an application circuit. Still further, any particular core trace may be associated with multiple R-layer traces such that inductive coupling may arise in a core trace induced by each of multiple R-layer traces.

Figure 4:
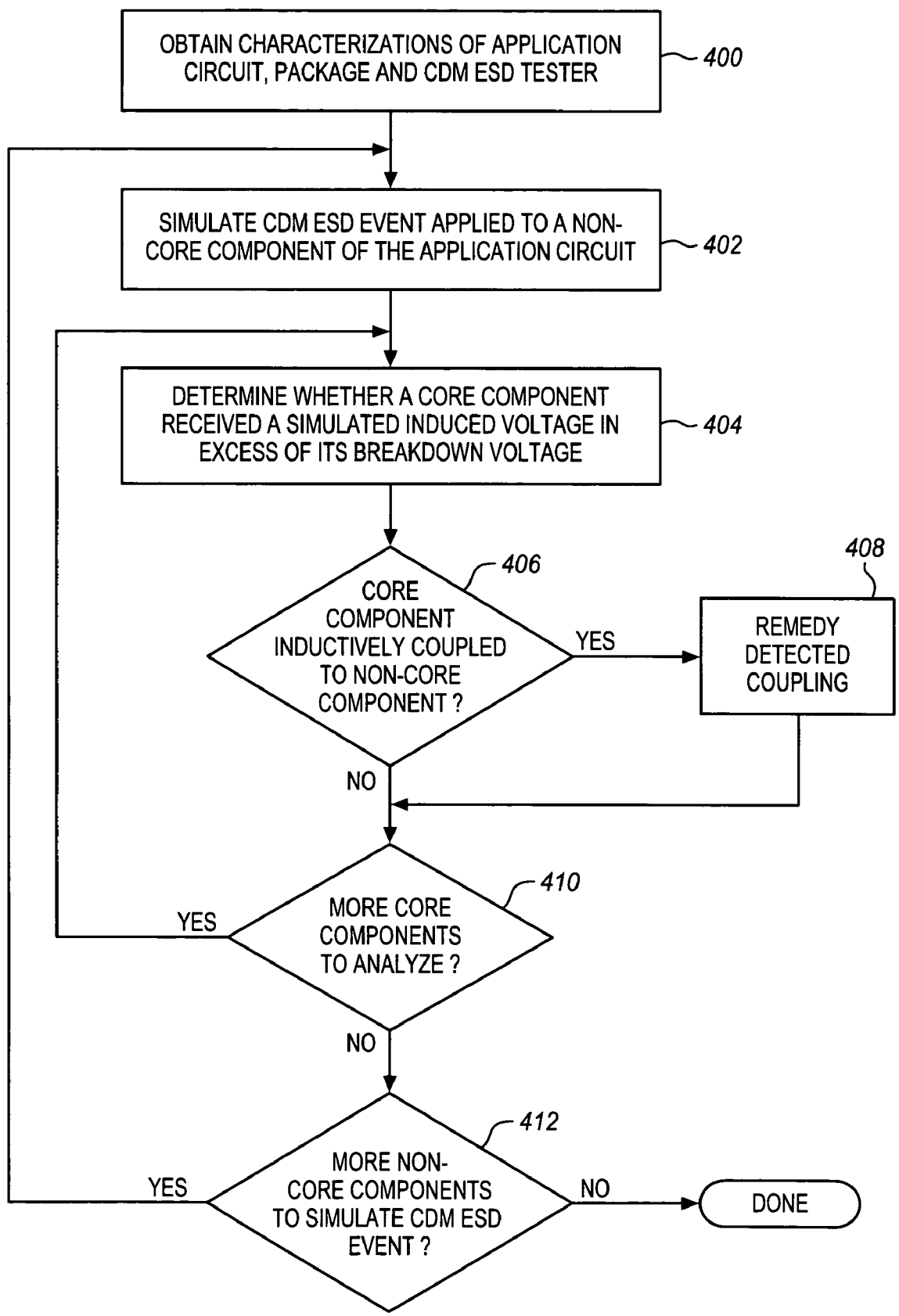
FIGS. 4 and 5 are flowcharts describing methods associated with features and aspects hereof to identify core components potentially affected by CDM ESD events and to remediate the identified traces by insertion of buffer circuits to shunt the damaging induced current.

FIG. 4 is a flowchart describing a method in accordance with features and aspects hereof to identify core traces that may be inductively coupled to associated R-layer traces and to remediate the potential harm to corresponding core circuits that may be caused by induced current and voltage resulting from CDM ESD events. The method of FIG. 4 may be performed within one or more systems that provide both circuit simulation and design features for an application circuit. As noted above with respect to FIG. 3, such simulation and design systems are well known to those of ordinary skill in the art as standard commercial products and may be integrated as a single application program or segregated as multiple application programs running on one or more compute nodes such as personal computers or engineering workstations.

Element 400 is first operable to obtain electrical characterization information regarding the application circuit per se, regarding packaging of the circuit, and any CDM ESD testing system used for testing a component for immunity to such events. Electrical characterization information regarding the application circuit per se is generally incorporated within the design information through standardized models of each component used within the application circuit design. Electrical characterization information regarding packaging of the application circuit may either be computed from standardized models generally known to those of ordinary skill in the art or may be acquired by empirically gathering test data to characterize parasitic electrical parameters of the packaging. In like manner parasitic electrical parameters associated with the CDM ESD testing system used for generating CDM ESD events may also be provided by standard models and computations well known to those skilled in the art or may be gathered from empirical data monitoring of test events generated by such a testing system.

Element 402 is next operable to simulate the CDM ESD event applied to a non-core component of the application circuit. As noted above, non-core components may include any I/O circuitry associated with the application circuit (e.g., that which may be exposed externally to the application circuit). Simulation performed by element 402 reveals core traces inductively coupled to the traces associated with the non-core component to which the simulated CDM ESD event is applied. Elements 404 through 410 are then iteratively operable to identify any core components that may be damaged by induced current and voltage arising from the CDM ESD simulated event applied to an identified non-core component of the application circuit. Element 406 then determines whether any core component within the application circuit indicates that it may receive an inappropriate breakdown voltage caused by the induced current and voltage from the non-core component CDM ESD event. If some core component is identified as having received such a potentially damaging breakdown voltage, element 408 is then operable to remedy the detected inductive coupling. Element 410 determines whether any additional core components need be analyzed by operation of the elements 404 through 408 to identify potential other core components that may be inductively coupled to the non-core component receiving the simulated CDM ESD event. If more core components remain to be analyzed, processing continues looping back to element 404 until all core components identified as likely receiving damaging breakdown voltage have been identified and remedied by operation of element 408. Element 412 is then operable to determine whether more non-core components may be tested by application of a similar simulated CDM ESD event. If so, processing continues looping back to element 402 to repeat simulated test event on the next non-core component. When the process completes, all core components likely to be affected through inductive coupling to a non-core component receiving a CDM ESD event will be identified and appropriately remedied in the application circuit design.

Figure 5:
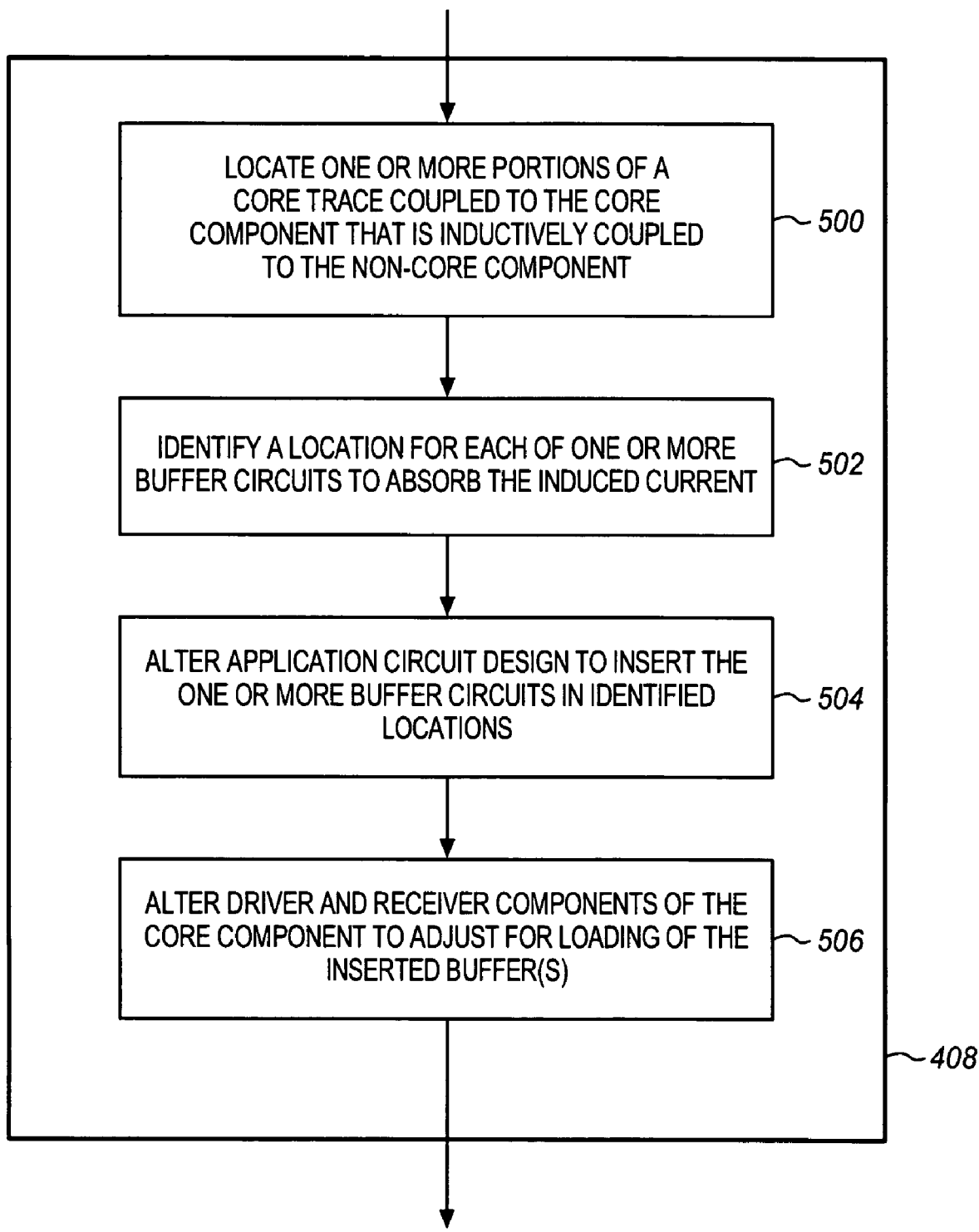

Numerous potential remedies for such identified core components may be performed by operation of element 408. In particular, FIG. 5 shows an exemplary embodiment in accordance with features and aspects hereof in which element 408 is operable to remediate an identified core component in the application circuit design to help prevent damage from induced voltage in excess of the component's breakdown voltage. Element 500 is first operable to locate one or more portions of a core trace coupled to the identified core component identified as inductively coupled to a non-core component and thus susceptible to damage from CDM ESD events. As noted above, a core trace coupled to a core component identified as susceptible to damage may have one or more portions of the trace a sufficiently proximal and R-layer trace to receive the potentially damaging induced current and voltage. Element 500 therefore represents processing to identify each such portion of the core trace. In some cases, the entirety of a core trace may be identified as a single portion while in other cases routing of the core trace made direct some portions near the R-layer trace while other portions may be sufficiently displaced from the R-layer trace to not receive significant induced current and voltage. For each identified portion of the core trace inductively coupled to the non-core component, element 502 is operable to identify an appropriate location for insertion of one or more buffer circuits to shunt/absorb the induced current. The current so induced is thereby shunted to reduce the induced voltage eventually applied to a receiving component of the identified core component. Thus, the receiving component along with the inserted one or more buffer circuits are all guarded from receiving the full impact of the induced current and voltage flow.

Element 504 is next operable to alter the application circuit design information to insert one or more buffer circuits at the identified locations in the one or more portions of the identified core trace coupled to the affected core component. As noted above, one or more inserted buffer circuits may be approximately evenly distributed over each corresponding, identified portion of the core trace associated with the core component to be guarded. Other distributions of the inserted buffer circuits over the span of the identified portion of the core trace will be readily apparent to those of ordinary skill in the art to effectively distribute the induced current for shunting over the inserted buffer circuits.

Element 506 is then operable to determine appropriate alterations to the driver and receiver components of the identified core component to adjust for the affect of the inserted buffer circuits on the normal signal timing. As noted above, the size of the driver circuit, the receiver circuit, and the inserted buffer circuit associated with an affected core trace may be selected according to well known design choices to adjust for timing effects of the inserted buffer (or buffers). Thus the design may be altered to mitigate for the effects on signal timing due to buffer insertion.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A method for improving an application circuit design for protection from ESD events wherein the application circuit includes a plurality of core circuits and a non-core circuit, the method comprising:
    simulating application circuit design operation in response to a simulated CDM ESD event applied to the non-core circuit to identify a core circuit inductively coupled to the non-core circuit; and
    automatically altering the application circuit design to add a protective circuit in the core circuit identified as inductively coupled to the non-core circuit,
    wherein the step of stimulating further comprises:
        characterizing electrical parameters of the application circuit;
        characterizing electrical properties of a package enclosing the application circuit; and
        characterizing electrical parameters of an ESD testing system used to generate ESD events applied to the application circuit through the package.

2. The method of claim 1
    wherein the step of characterizing electrical properties of a package enclosing the application circuit further comprises characterizing parasitic electrical characteristics of the package.

3. The method of claim 1
    wherein the step of characterizing electrical properties of the ESD testing system further comprises characterizing parasitic electrical characteristics of the testing system.

4. The method of claim 1
    wherein the step of simulating further comprises identifying a victim component of the core circuits in which simulated inductive current causes the victim component to receive a breakdown voltage, and
    wherein the step of automatically altering further comprises adding a buffer component to a signal path of the core circuits from which the victim component received the breakdown voltage in simulation.

5. The method of claim 1
    wherein the step of simulating further comprises:
        identifying a victim component of the core circuits in which simulated inductive current causes the victim component to receive a breakdown voltage; and
        identifying a core trace of the core circuits coupled to the victim component in which the simulated inductive current is induced, and
    wherein the step of automatically altering further comprises adding a buffer component to the identified core trace from which the victim component received the breakdown voltage in simulation.

6. The method of claim 5
    wherein the step of adding further comprises:
        identifying an R-layer trace of the non-core circuits that directly receives the simulated ESD event signal;
        identifying a portion of the identified core trace in which the simulated inductive current is induced by proximity to the identified R-layer trace wherein the identified portion has a driver circuit of the core circuits at one end of the identified portion and a receiver circuit of the core circuits at an opposite end of the identified portion; and
        inserting in the application circuit design a buffer circuit in the identified portion between the driver circuit and the receiver circuit to reduce the induced voltage applied to the receiver circuit.

7. A system for reducing susceptibility to damage to a core circuit of an application circuit design due to CDM ESD events applied to a non-core circuit of the application circuit, the system comprising:
    a simulation system adapted to identify a core trace coupled to the core circuit susceptible to inductive coupling with the non-core circuit; and
    a design system for designing the application circuit design and communicatively coupled to the simulation system and adapted to automatically alter the application circuit design to insert a buffer circuit in the identified core trace to prevent damage to the core circuit in response to CDM ESD events,
    wherein the simulation system is further adapted to characterize electrical parameters of the application circuit, to characterize electrical properties of a package enclosing the application circuit, and to characterize electrical parameters of an ESD testing system used to generate ESD events applied to the application circuit through the package.

8. The system of claim 7
    wherein the simulation system is adapted to identify the core trace as a trace coupled to the core circuit in which an induced current applies an induced voltage to the core circuit in excess of a breakdown voltage associated with the core circuit.

9. The system of claim 8
    wherein the design system is further adapted to identify an R-layer trace of the non-core circuit that directly receives the simulated ESD event signal,
    wherein the design system further adapted to identify a portion of the identified core trace in which the simulated inductive current is induced by proximity to the identified R-layer trace wherein the identified portion has a driver circuit at one end of the identified portion and a receiver circuit at an opposite end of the identified portion, and
    wherein the design system is further adapted to insert the buffer circuit in the application circuit design in the identified portion between the driver circuit and the receiver circuit to reduce the induced voltage applied to the receiver circuit.

10. A method, operable in a data processing system, for designing an application circuit to reduce susceptibility of the application circuit to damage of core circuits of the application circuit due to CDM ESD events applied to non-core circuits of the application circuit, the method comprising:

identifying an R-layer trace coupled to a non-core circuit of the application circuit that may receive a CDM ESD event;

identifying one or more core traces within the application circuit that are inductively coupled with the R-layer trace such that the magnitude of an induced current in response to the CDM ESD event may induce a voltage at a receiver circuit coupled to the core trace in excess of the breakdown voltage of the receiver circuit; and inserting a buffer circuit in each of the identified one or more core traces such that the induced voltage applied to the receiver circuit in response to the CDM ESD event remains below the breakdown voltage, wherein the step of identifying one or more core traces further comprises simulating operation of the application circuit in response to a simulated CDM ESD event applied to the application circuit, wherein the step of simulating further comprises:

characterizing electrical parameters of the application circuit;

characterizing electrical properties of a package enclosing the application circuit; and characterizing electrical parameters of an ESD testing system used to generate ESD events applied to the application circuit through the package.

11. The method of claim 10 further comprising:

identifying a portion of each of the identified one or more core traces that receives the induced current, wherein the step of inserting further comprises inserting the buffer circuit in the identified portion to minimize induced voltage applied to the receiver circuit and to minimize the induced voltage applied to the buffer circuit.

12. The method of claim 11 wherein the step of inserting further comprises inserting the buffer circuit at substantially the midpoint of the identified portion.

* * * * *